(12) United States Patent
Young et al.

(10) Patent No.: US 12,477,767 B2
(45) Date of Patent: Nov. 18, 2025

(54) SEMICONDUCTOR DEVICE AND METHOD

(71) Applicant: Taiwan Semiconductor Manufacturing Co., Ltd., Hsinchu (TW)

(72) Inventors: Bo-Feng Young, Taipei (TW); Po-Chi Wu, Zhubei (TW); Che-Cheng Chang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 32 days.

(21) Appl. No.: 18/473,721

(22) Filed: Sep. 25, 2023

(65) Prior Publication Data

US 2024/0030319 A1    Jan. 25, 2024

Related U.S. Application Data

(63) Continuation of application No. 17/853,104, filed on Jun. 29, 2022, now Pat. No. 11,784,242, which is a
(Continued)

(51) Int. Cl.
| | |
|---|---|
| *H10D 30/01* | (2025.01) |
| *H01L 21/3065* | (2006.01) |
| *H10D 30/62* | (2025.01) |
| *H10D 30/69* | (2025.01) |
| *H10D 62/17* | (2025.01) |

(Continued)

(52) U.S. Cl.
CPC ..... *H10D 30/0245* (2025.01); *H01L 21/3065* (2013.01); *H10D 30/024* (2025.01); *H10D 30/62* (2025.01); *H10D 30/797* (2025.01); *H10D 62/292* (2025.01); *H10D 64/017* (2025.01); *H10D 62/822* (2025.01)

(58) Field of Classification Search
CPC ............ H10D 30/0245; H10D 62/292; H10D 64/017; H10D 62/822; H10D 64/021; H10D 84/013; H10D 84/0147; H10D 84/0158; H10D 84/038; H10D 62/151
See application file for complete search history.

(56) References Cited

U.S. PATENT DOCUMENTS

| | | | |
|---|---|---|---|
| 8,299,564 | B1 | 10/2012 | Wu et al. |
| 8,836,016 | B2 | 9/2014 | Wu et al. |
| (Continued) | | | |

FOREIGN PATENT DOCUMENTS

| | | |
|---|---|---|
| CN | 103545366 A | 1/2014 |
| CN | 106252350 A | 12/2016 |
| (Continued) | | |

OTHER PUBLICATIONS

Widman, et al., "Technologie hochintegrierter Schaltungen," Springer-Verlag Berlin Heidelberg, ISBN 3-540-59357-8, 1996, 4 pages.

*Primary Examiner* — Fernando L Toledo
*Assistant Examiner* — Adam S Bowen
(74) *Attorney, Agent, or Firm* — Slater Matsil, LLP

(57) ABSTRACT

A manufacturing process and device are provided in which a first opening in formed within a substrate. The first opening is reshaped into a second opening using a second etching process. The second etching process is performed with a radical etch in which neutral ions are utilized. As such, substrate push is reduced.

20 Claims, 8 Drawing Sheets

Related U.S. Application Data continuation of application No. 16/871,984, filed on May 11, 2020, now Pat. No. 11,387,351, which is a continuation of application No. 16/390,940, filed on Apr. 22, 2019, now Pat. No. 10,665,700, which is a continuation of application No. 15/638,738, filed on Jun. 30, 2017, now Pat. No. 10,269,940.

(51) Int. Cl.
 *H10D 64/01* (2025.01)
 *H10D 62/822* (2025.01)

(56) References Cited

U.S. PATENT DOCUMENTS

| | | | |
|---|---|---|---|
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,508,556 B1 | 11/2016 | Tsai et al. | |
| 9,520,482 B1 | 12/2016 | Chang et al. | |
| 9,576,814 B2 | 2/2017 | Wu et al. | |
| 2009/0161349 A1 | 6/2009 | Smith | |
| 2010/0173493 A1 | 7/2010 | Kushibiki et al. | |
| 2011/0220964 A1 | 9/2011 | Shin et al. | |
| 2011/0312145 A1* | 12/2011 | Tsai | H10D 84/0167 438/300 |
| 2012/0001238 A1* | 1/2012 | Tsai | H10D 84/038 438/300 |
| 2014/0197493 A1 | 7/2014 | Tsai et al. | |
| 2015/0069466 A1* | 3/2015 | Chang | H01L 21/30604 438/303 |
| 2015/0140757 A1 | 5/2015 | Kim et al. | |
| 2015/0263138 A1 | 9/2015 | Kim | |
| 2015/0332941 A1 | 11/2015 | Tobin et al. | |
| 2015/0340465 A1 | 11/2015 | Harley et al. | |
| 2016/0247726 A1 | 8/2016 | Huang et al. | |
| 2016/0276437 A1 | 9/2016 | Cheng et al. | |
| 2016/0300906 A1 | 10/2016 | Chen | |
| 2017/0005011 A1 | 1/2017 | Ching et al. | |
| 2017/0110327 A1 | 4/2017 | Kim et al. | |
| 2017/0110579 A1 | 4/2017 | Chang et al. | |

FOREIGN PATENT DOCUMENTS

| | | |
|---|---|---|
| KR | 20110103158 A | 9/2011 |
| KR | 20150066581 A | 6/2015 |
| TW | 201246369 A | 11/2012 |
| TW | 201714309 A | 4/2017 |

\* cited by examiner

SEMICONDUCTOR DEVICE AND METHOD

PRIORITY CLAIM AND CROSS-REFERENCE

This application is a continuation of U.S. patent application Ser. No. 17/853,104, filed Jun. 29, 2022, entitled "Semiconductor Device and Method," which is a continuation of U.S. patent application Ser. No. 16/871,984, filed May 11, 2020, entitled "Semiconductor Device and Method," now U.S. Pat. No. 11,387,351 issued on Jul. 12, 2022, which is a continuation of U.S. patent application Ser. No. 16/390,940, filed Apr. 22, 2019, entitled "Semiconductor Device and Method," now U.S. Pat. No. 10,665,700 issued on May 26, 2020, which is a continuation of U.S. patent application Ser. No. 15/638,738, filed Jun. 30, 2017, entitled "Semiconductor Device and Method," now U.S. Pat. No. 10,269,940 issued on Apr. 23, 2019, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
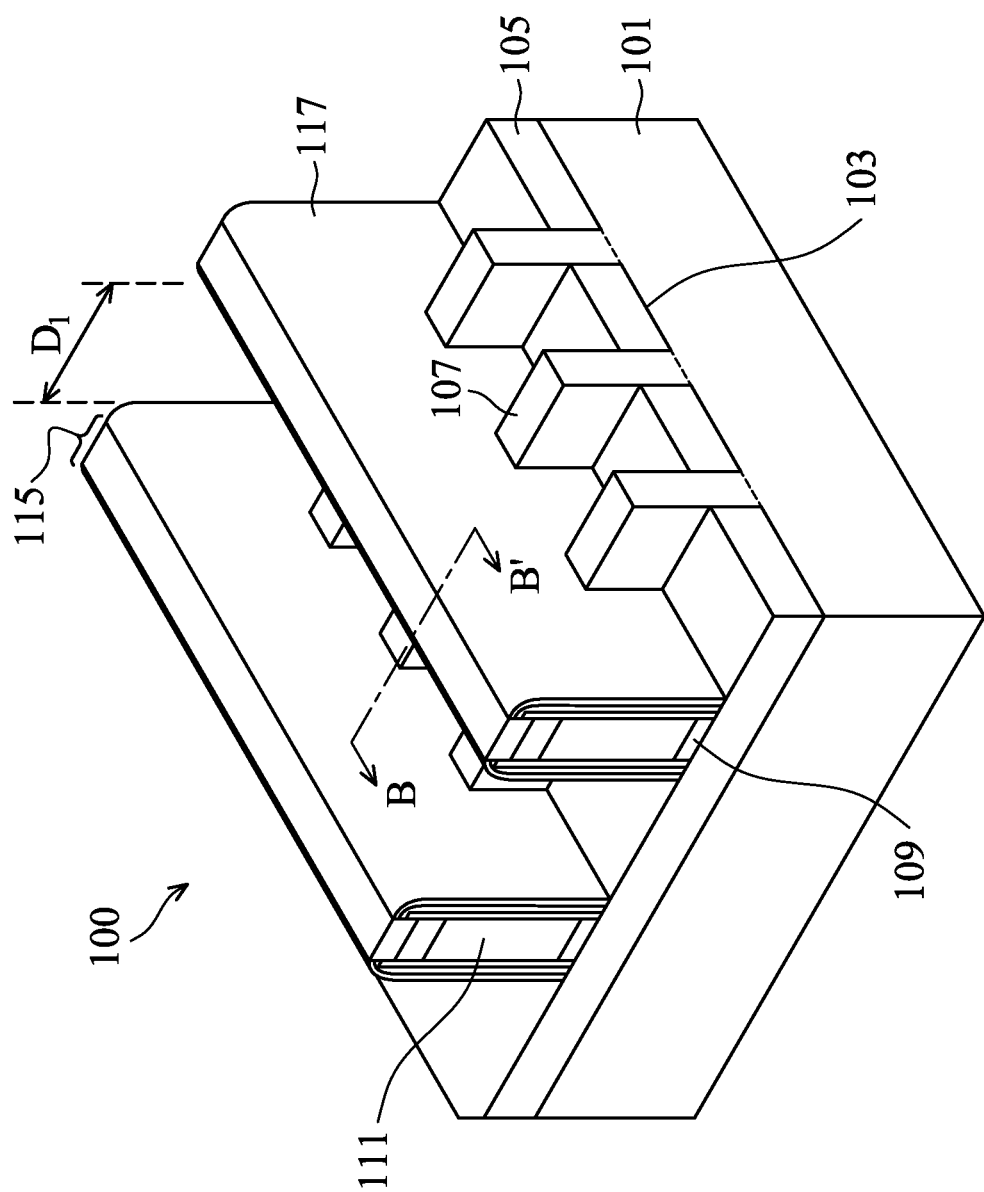
FIGS. 1A-1B illustrate a finFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
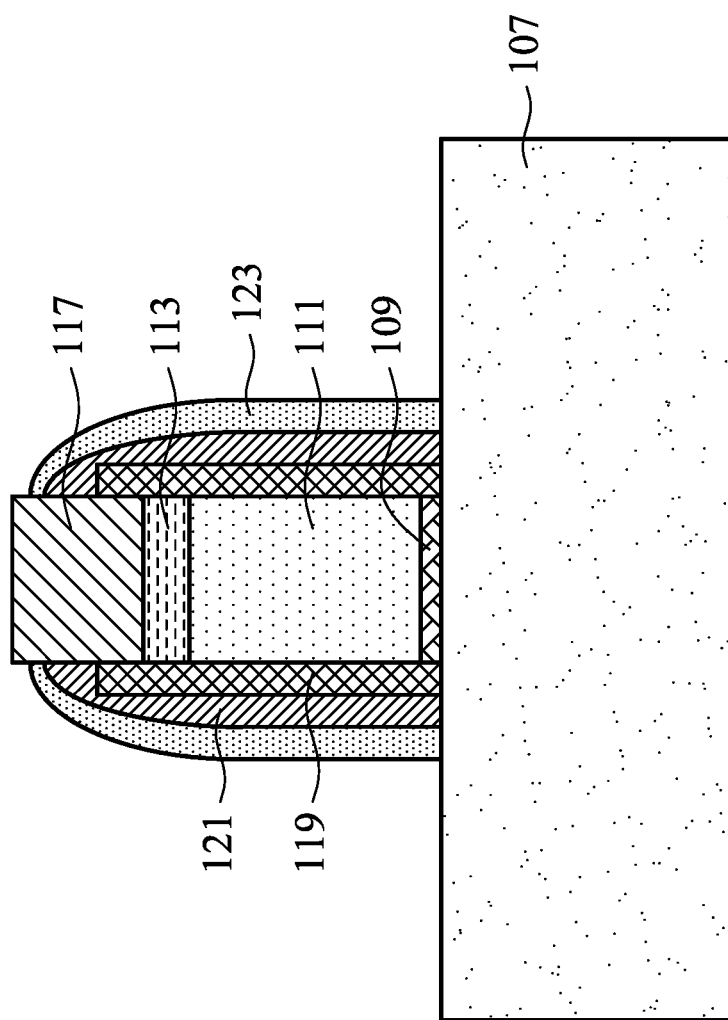

With reference now to FIGS. 1A and 1B (wherein FIG. 1B illustrates a cross-sectional view of FIG. 1A along line B-B'), there is illustrated a perspective view of a semiconductor device too such as a finFET device (e.g., a PMOSFET or NMOSFET). In an embodiment the semiconductor device too comprises a substrate 101 with first trenches 103 formed therein. The substrate 101 may be a silicon substrate, although other substrates, such as semiconductor-on-insulator (SOI), strained SOL and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1A) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1A only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about to nm and about too nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 to form fin heights of between about 300 Å and about 700 Å, such as about 500 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109 and a dummy gate electrode 111 over the dummy gate dielectric 109 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of gate stacks 115 over the fins 107. The gate stacks 115 define multiple channel regions located on each side of the fins 107 beneath the dummy gate dielectric 109. The gate stacks 115 may be formed by depositing and patterning a first hard mask 113 and a second hard mask 117 over the dummy gate dielectric 109 and the dummy gate electrode 111. In an embodiment the first hard mask 113 may be a material such as silicon nitride, although any suitable masking materials, such as silicon oxide, silicon oxynitride, SiCON, SiC, SiOC, may also be utilized. The first hard mask 113 may be formed using a deposition process such as chemical vapor deposition or physical vapor deposition, and may be formed to a thickness of between about 50 Å and about 500 Å, such as about 200 Å. However, any suitable process or thickness may be utilized.

The second hard mask 117 may be formed over the first hard mask 113. In an embodiment the second hard mask 117 may be a material different from the first hard mask 113, such as by being silicon oxide, although any other suitable materials, such as silicon oxynitride, SiCON, SiC, SiOC, and/or silicon nitride may also be used. Additionally, the second hard mask 117 may be formed using a deposition process such as chemical vapor deposition or physical vapor deposition, and may be formed to a thickness of between about 200 Å and about woo A, such as about 600 Å. However, any suitable process or thickness may be utilized.

Once the first hard mask 113 and the second hard mask 117 have been formed, the second hard mask 117 may be patterned using, e.g., one or more photolithographic masking and etching processes. Further, once the second hard mask 117 has been patterned, the pattern of the second hard mask 117 may be transferred to the first hard mask 113, the dummy gate electrode iii and the dummy gate dielectric 109 using one or more etching process that utilizes the second hard mask 117 as a masking material. However, any suitable process may be utilized.

After the gate stack 115 has been formed, sidewalls of the gate stack 115 may be protected by depositing materials to cover the sidewalls of the gate stack 115. In an embodiment the sidewalls of the gate stack 115 may be protected by depositing a first spacer material 119, a second spacer material 121, and a third spacer material 123. In an embodiment the first spacer material 119 may be a material such as silicon nitride formed using a conformal method such as atomic layer deposition, although any suitable method, such as chemical vapor deposition or physical vapor deposition may also be utilized. The first spacer material 119 may be deposited to have a thickness of between about to A and about 40 Å, such as about 2 nm, although any suit able method may be utilized. Once deposited, the first spacer material 119 may be patterned using, e.g., one or more etching processes.

The second spacer material 121 is deposited over the first spacer material 119 and may be a material different from the first spacer material 119, such as by being SiOCN, although any other suitable material, such as SiCN or SiOC, may alternatively be utilized. The second spacer material 121 may be formed using either a conformal deposition process, such as atomic layer deposition, or other deposition processes, such as chemical vapor deposition or physical vapor deposition in order to form a blanket layer of the material of the second spacer material 121.

Once the second spacer material 121 has been deposited, the second spacer material 121 may be patterned. In an embodiment the second spacer material 121 may be patterned using, e.g., one or more etches either after the deposition of the second spacer material 121 to remove portions of the second spacer material 121 from the horizontal surfaces of the structure.

Once the first spacer material 119 and the second spacer material 121 have been patterned, the third spacer material 123 may be formed. In an embodiment the third spacer material 123 may be formed of a material such as silicon nitride, although any other suitable material may be utilized. In an embodiment the third spacer material 123 may be blanket deposited using a deposition process such as chemical vapor deposition, physical vapor deposition, or atomic layer deposition, and then the third spacer material 123 may be patterned by one or more etches in order to remove the third spacer material 123 from the horizontal surfaces of the structure.

Figure 2:
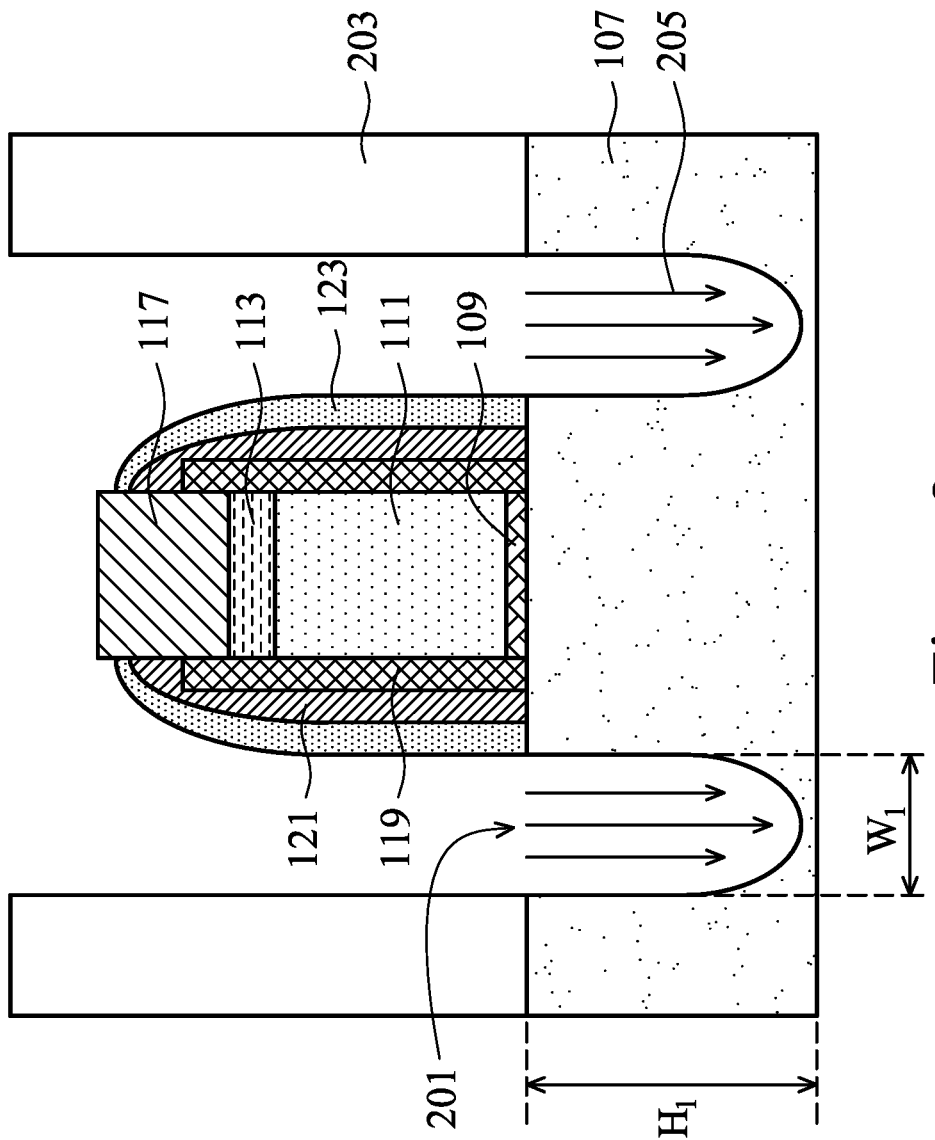
FIG. 2 illustrates formation of a first opening in a fin in accordance with some embodiments.

FIG. 2 illustrates a first step in a process to remove a portion of the fins 107 and form first openings 201 within the fins 107. In an embodiment the removal process may begin by placing a mask 203 to cover those portions of the fin 107 (and, if desired, the gate stack 115) that are desired to not be removed. In an embodiment the mask 203 may be a photosensitive material, such as a photoresist, that has been placed, exposed, and developed in order to form the mask 203. However, any suitable mask material may be utilized.

Once the mask 203 is in place, a first etching process (represented in FIG. 2 by the arrows labeled 205) is utilized to form the first openings 201 within the exposed portions of the fin 107. In an embodiment the first etching process 205 may be an anisotropic etching process such as a reactive ion etch (RIE) using an etchant that is suitable for etching the material of the fin 107. As such, while the particular etchant chosen is dependent at least in part upon the material of the fin 107, in an embodiment in which the fin 107 comprises silicon, the etchant may be arsenic, phosphorus or boron in combination with any other suitable etchants or diluents that may be desired. However, any suitable etchant may be utilized.

In a particular embodiment the first etching process 205 may be performed by receiving the etchant and forming a plasma before the material of the fin 107 contacts the etchant. In a particular embodiment the etchant may be ignited into the plasma within an etching chamber (not separately illustrated in FIG. 2), although any suitable method of forming the plasma (including a remote plasma system), may be utilized. Additionally, once the plasma has been ignited, the first etching process 205 may be performed at a power of between about 150 W and about 550 W, such as about 350 W and a bias of between about 60 V and about 180 V, such as about 130 V. The first etching process 205 may continue at a temperature of between about 30° C. and about 70° C., such as about 60° C., and a pressure of between about 3 mTorr and about 100 mTorr, such as about 5 mTorr. However, any suitable process conditions may be utilized.

By using the first etching process 205, the first opening 201 is formed within the fin 107. In particular, by using an anisotropic etching process for the first etching process 205, the first opening 201 will form with a "U" shape. For example, the first opening 201 will have a first height $H_1$ of between about 300 Å and about 700 Å, such as about 450 Å, and will also have a first width $W_1$ of between about 100 Å and about 500 Å, such as about 200 Å. However, any suitable dimensions may be utilized.

Figure 3A:
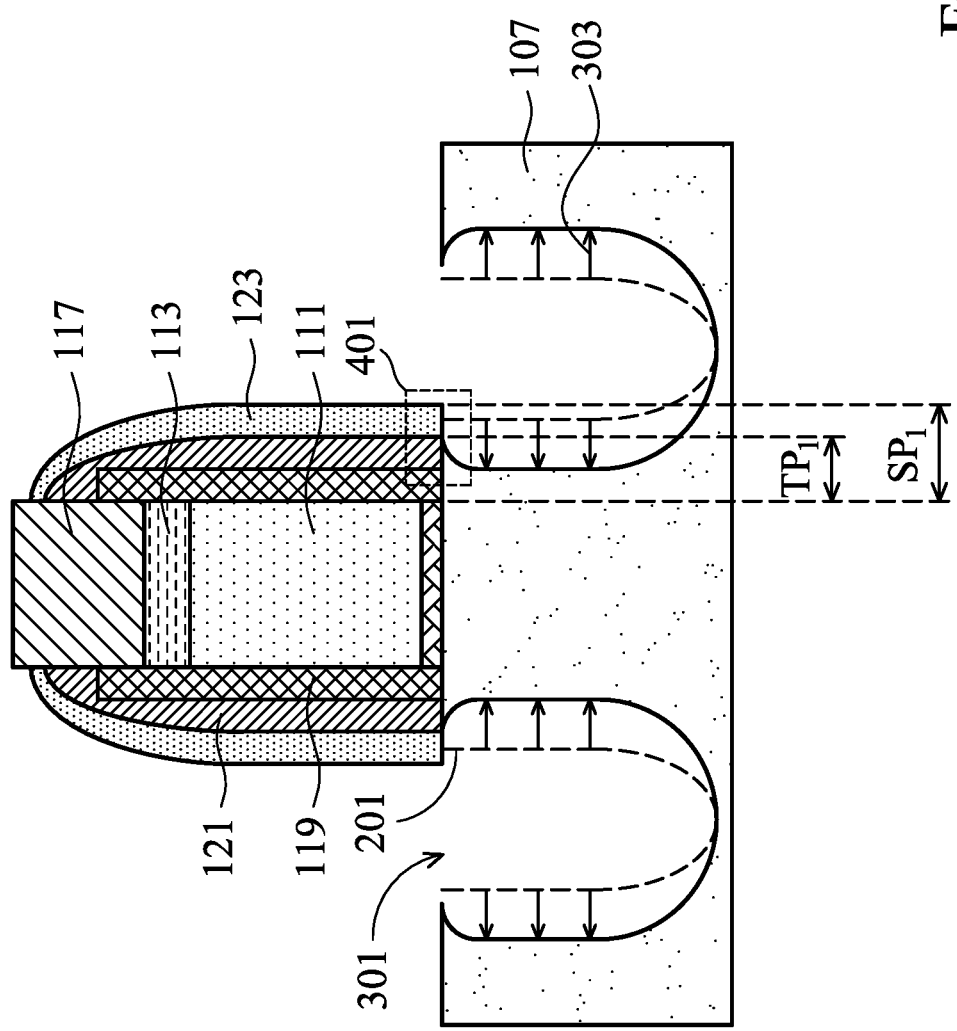
FIGS. 3A-3C illustrate formation of a second opening in the fin in accordance with some embodiments.

FIG. 3A illustrates a removal of the mask 203 and an ex-situ, second etching process (represented in FIG. 3A by the arrows labeled 303) which is utilized to modify the shape of the first opening 201 into a second opening 301 (with the shape of the first opening 201 being shown for comparison using the dashed lines labeled 201). In an embodiment in which the mask 203 is a photoresist, the mask 203 may be removed by an ashing process, whereby the temperature of the photoresist is raised to a point where the photoresist undergoes thermal decomposition. The mask 203 may then be easily removed. However, any suitable method may be used to remove the mask 203.

In an embodiment the second etching process 303 is an isotropic etching process which uses radicals from a second etching precursor 309 (not illustrated in FIG. 3A but illustrated and described below with respect to FIG. 3B) instead of a plasma in order to etch the material of the fin 107 (e.g., silicon) and form the second opening 301 by reshaping the first opening 201. In an embodiment the second etching precursor 309 may be chosen to be selective to the material of the fin 107 without overly reacting with the material of the other exposed structures. As such, while the precise material of the second etching precursor 309 may be dependent at least in part on the material of the fin 107, in an embodiment in which the fin 107 is silicon, the second etching precursor 309 may be a nitrogen containing gas such as ammonia ($NH_3$). However, any other suitable precursor, such as $NF_3$ or $H_2$, may be utilized.

Figure 3B:
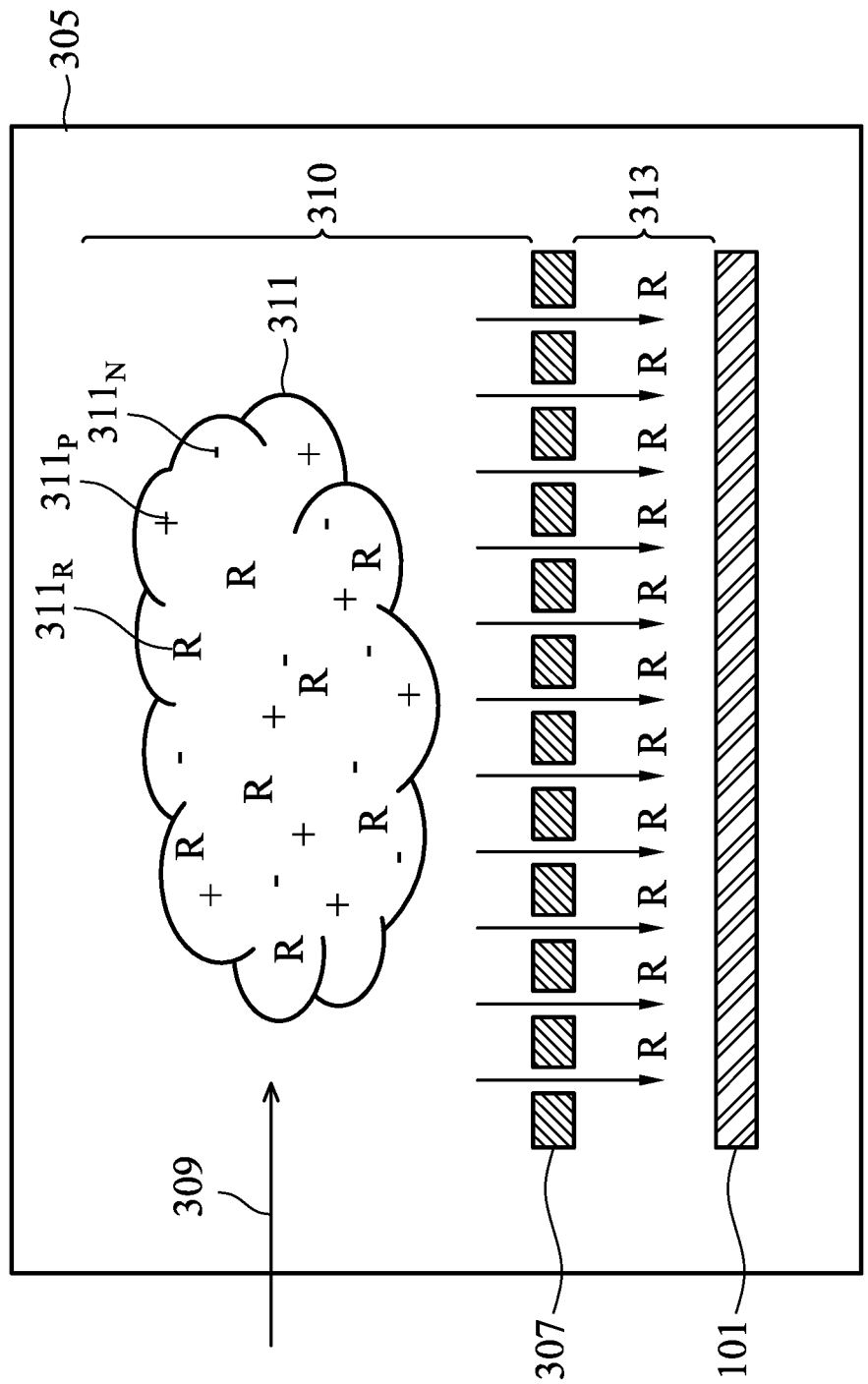

FIG. 3B illustrates that to begin the second etching process 303, the fin 107 (on the substrate 101) is placed within an etching chamber 305 below a selective modulation device 307. In an embodiment the selective modulation device 307 may be an electrically charged grating that acts as a barrier to the movement of charged ions from a plasma while allowing uncharged plasma components (e.g., radicals) to pass through the selective modulation device 307. In an embodiment the selective modulation device 307 can prevent the charged plasma ions (e.g., positively charged ions or negatively formed ions) from passing by either repelling the charged plasma ions or else by attracting the charged plasma ions. However, any suitable device that can separate radicals from a plasma may be utilized.

Once the substrate 101 with the fin 107 has been placed within the chamber, the second etching process 303 may be initiated by introducing the second etching precursor 309 (e.g., $NH_3$) into a plasma region 310 of the etching chamber 305. In an embodiment the second etching precursor 309 may be introduced at a flow rate of between about 10 sccm and about 10000 sccm, such as about 500 sccm. However, any suitable flow rate of the second etching precursor 309 may be utilized.

Once the second etching precursor 309 has been introduced in the plasma region 310 of the etching chamber 305, the second etching precursor 309 is energized and ignited in order to form a plasma 311 comprising positive ions $311_P$, negative ions $311_N$, and radical components $311_R$ disposed within the plasma region 310. In an embodiment the plasma 311 may be generated using radio frequency energy at a power of between about 10 Watts and about 2500 Watts within the etching chamber 305, although any suitable processing conditions or methods may be utilized to ignite the plasma.

Additionally, while the above process is described as being introduced into the etching chamber 305 and then ignited, this is intended to be an illustrative embodiment and is not intended to be limiting to the embodiments. Rather, any suitable method of providing a plasma, such as using a remote plasma system, may also be utilized. All such method are fully intended to be included within the scope of the embodiments.

Once the plasma 311 has been generated, the selective modulation device 307 allows the radical components $311_R$ to pass through the selective modulation device 307 into a wafer processing region 313 of the etching chamber 305 where the substrate 101 with the fin 107 is located. Additionally, the selective modulation device 307 prevents the movement of the positive ions $311_P$ and also the negative ions $311_N$ from entering the wafer processing region 313 of the etching chamber 305. In effect, the selective modulation device 307 is utilized to filter the positive ions $311_P$ and the negative ions $311_N$ from the plasma 311, thereby allowing only the radical components $311_R$ to be used in the second etching process 303.

In an embodiment the radical only etch of the second etching process 303 may be performed at a pressure of between about 1 torr and about 20 torr, such as about 2 torr and a temperature of between about 10° C. and about too ° C., such as about 40° C. Additionally, the second etching process 303 may be performed for a time of between about 5 s and about 100 s, such as about 10 s. However, any suitable process conditions may be utilized.

By performing the second etching process 303 as a radical etch instead of a plasma etch, only neutral ions with a smaller charge than either the positive ions $311_P$ or the negative ions $311_N$ are utilized to reshape the first opening 201 into the second opening 301. As such, there is less rounding of first opening 201 during the second etching process 303 as the surface proximity of the fin 107 is pushed outwards from the "U" shape of the first opening 201. Additionally, with a less round shape, less material of the fin 107 (e.g., silicon) is being turned into a polymer by-product which interfere with other processes if not removed.

Figure 3C:
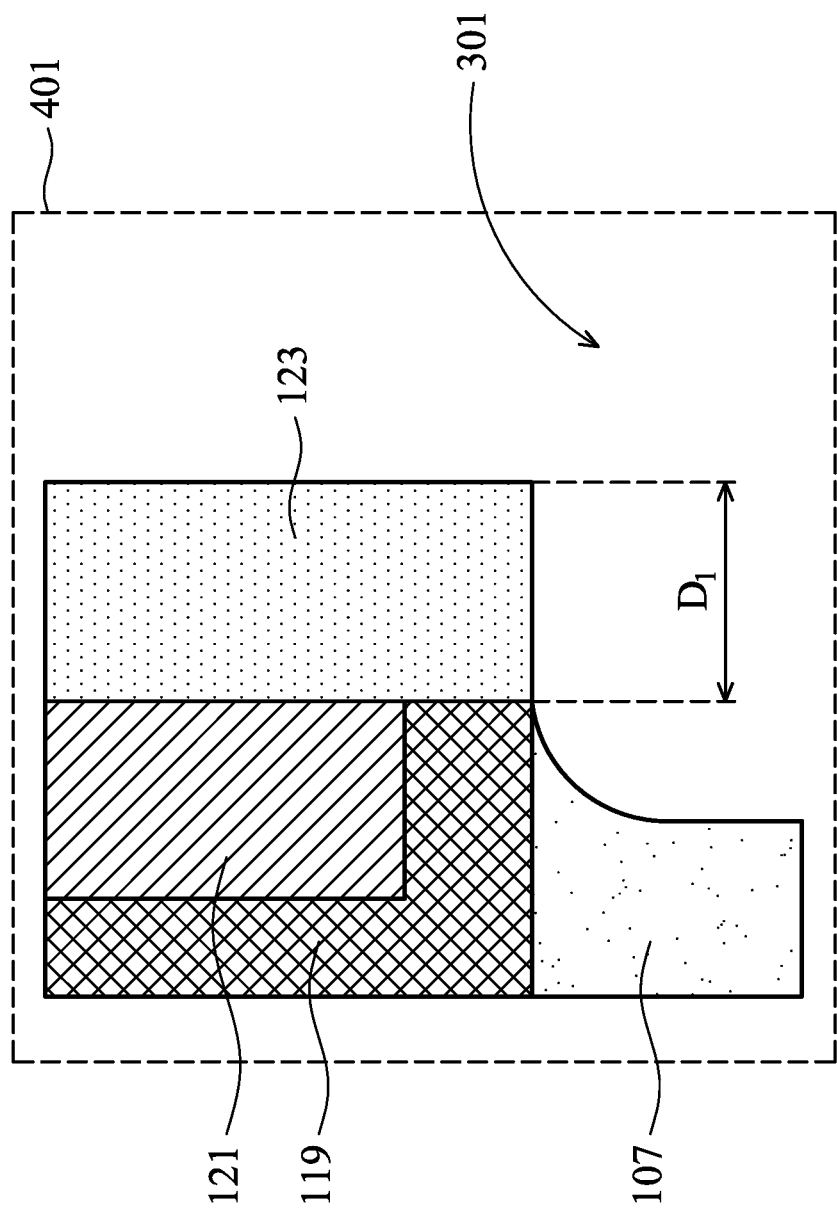

FIG. 3C helps to illustrate this benefit, and illustrates a close up view of the structure of FIG. 3A in the dashed box labeled 401. In this embodiment, the push of the material of the fin 107 (e.g., the push of silicon) will undercut the third spacer material 123 and form an overhanging eave (the distance between the tip of the fin 107 and the outer edge of the third spacer material 123). While previous etching processes (such as an plasma etch) would form an eave no larger than 1 nm, the use of the second etching process 301 as described herein can form an overhanging eave with a first distance $D_1$ of between about 1 nm and about 4 nm while minimizing other undesirable side effects.

Additionally, looking back at FIG. 3A, the second etching process 301 as described herein forms a less rounded shape than if plasma etches are utilized. In particular, if a reference line is aligned with an outer surface of the gate stack 115 (e.g., being aligned with a side of the dummy gate electrode 111 and/or the dummy gate dielectric 109), a first distance along the top surface of the material of the fin 107 from the reference line to the material of the fin 107 adjacent to the second opening 301 may be measured to obtain a surface proximity measurement $SP_1$. In a particular embodiment the surface proximity measurement $SP_1$ may be between about 20 Å and about 200 Å, such as about 50 Å. However, any suitable distance may be obtained.

Additionally, a second distance may be measured at a middle height of the fin 107 from the reference line to the material around the second opening 301 in order to obtain a tip proximity measurement $TP_1$. In an embodiment the tip proximity measurement $TP_1$ may be between about 1 nm and about 4 nm. However, any suitable distance may be obtained.

Given these two distances of the surface proximity measurement $SP_1$ and the tip proximity measurement $TP_1$, one measurement of the roundness of the second opening 301 may be determined by the difference between these two measurements. For example, in an embodiment a difference between the surface proximity measurement $SP_1$ and the tip proximity measurement $TP_1$ may be less than about 3 nm. This is an improvement over plasma based processes, which have a difference between the surface proximity measurement $SP_1$ and the tip proximity measurement $TP_1$ of greater than 3 nm.

Additionally, using the second etching process 301 as described herein allows for a greater control of the channel length within the fin 107. For example, a surface channel length within the fin 107 (as measured from a first surface tip to a second surface tip on an opposite side of the gate stack 115), may be shortened and have a distance of between about 30 nm and about 40 nm, which results in a boosted device properties. Additionally, a channel length at the tip (e.g., measured at half of the height of the fin 107) may be between 20 nm and about 40 nm. However, any suitable distances may be utilized.

Figure 4:
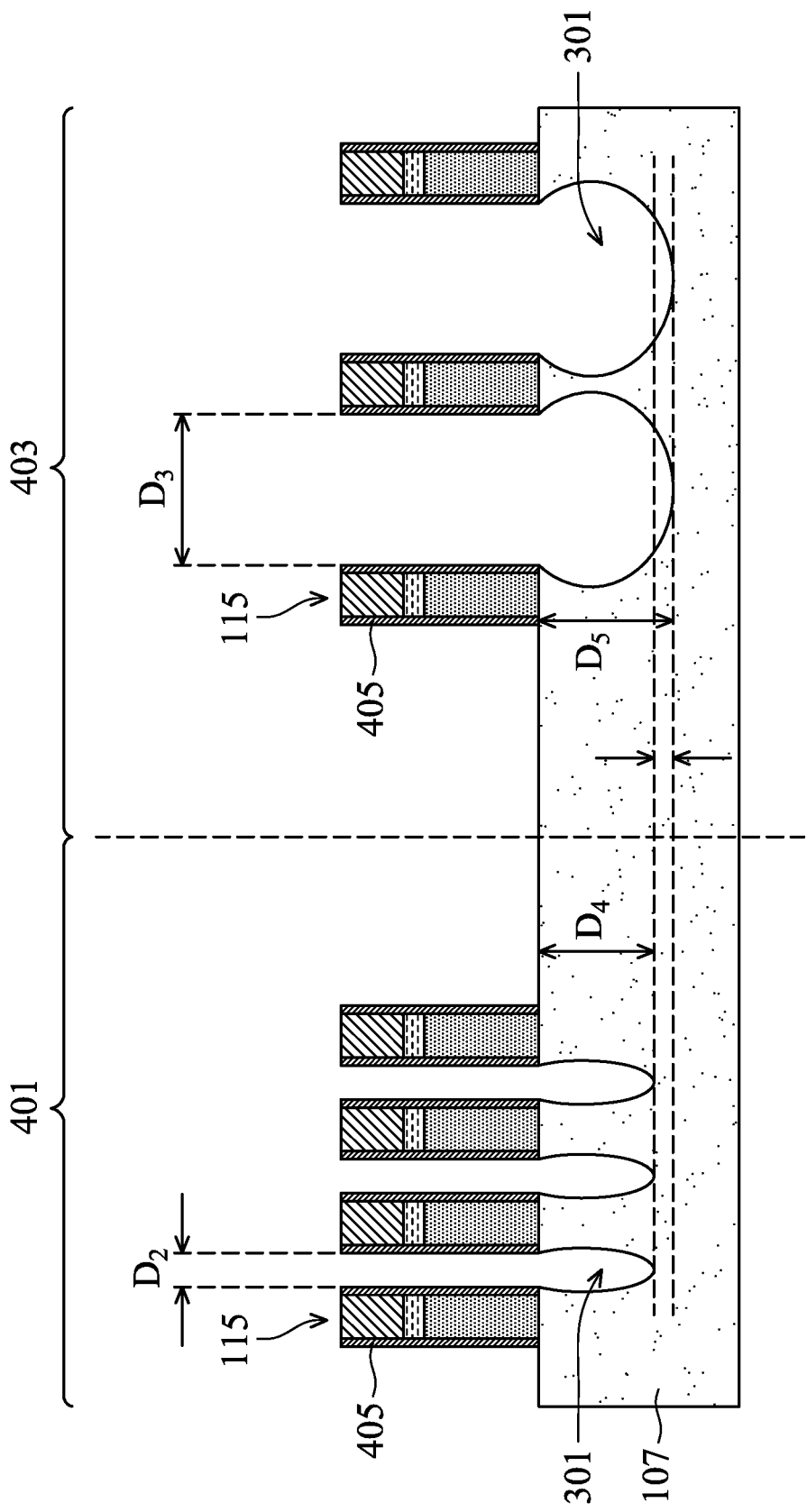
FIG. 4 illustrates a depth loading of the second openings in accordance with some embodiments.

FIG. 4 illustrates another benefit of using the second etching process 301 as described herein. In particular, FIG. 4 illustrates a plurality of fins 107 (illustrated as a single fin 107 stretching between two regions for convenience) in a first region 401 and a second region 403 of the substrate 101. In an embodiment the first region 401 of the substrate 101 is a region with a dense population of gate stacks 115. For example, in the first region 401 of the substrate 101 the gate stacks 115 (illustrated herein with the first spacer material 119, the second spacer material 121, and the third spacer material 123 being illustrated as a single spacer structure 405 for convenience), the gate stacks 115 with the spacer structures 405 are separated by a second distance $D_2$ of less than about too nm, such as being between about 20 nm and about 50 nm. However, any suitable distance may be utilized.

Additionally, the second region 403 may be a less dense region than the first region 401. For example, within the second region 403 the gate stacks 115 with their corresponding spacer structures 405 may be separated by a third distance $D_3$ which is greater than the second distance $D_2$, e.g., less than too nm. In a particular embodiment the third distance $D_3$ is between about too nm and about 400 nm. However, any suitable distance may be utilized.

Unfortunately, the differences is distance between the structures in the first region 401 and the structures in the second region 403 will also affect the first etching process 205 and the second etching process 303 such that openings formed between dense structures in the first region 401 are shallower than openings formed between the less dense structures in the second region 403. This difference in the depths of the openings is known as the depth loading of the structure, and large depth loadings can affect the Idsat uniformity (IDU/Intera) of the overall structure is improved between different patterns such as a ring oscillator (TCD), a ring oscillator (RO), and an input/output region (IO).

However, using the second etching process 303 as described herein, the depth loading may be adjusted to minimize the impact of the depth loading. In a particular example in which the gate stacks 115 and their corresponding spacer structures 405 in the first region 401 are separated by between about 20 nm and about 50 nm and the gate stacks 115 and their corresponding spacer structures 405 in the second region 403 are separated by between about too and about 400 nm, the use of the second etching process 303 allows the second openings 301 in the first region 401 to extend into the fin 107 by a fourth distance $D_4$ of between about 30 nm and about 70 nm, such as about 55 nm. Additionally, the second openings 301 in the second region 403 may extend into the fin 107 by a fifth distance $D_5$ of between about 30 nm and about 70 nm, such as about 50 nm. However, any other suitable distances may be utilized.

Given that the second openings 301 in the first region 401 extend into the fin 107 the fourth distance $D_4$ and the second openings 301 in the second region 403 extend into the fin 107 the fifth distance $D_5$, the depth loading between the second region 403 and the first region 401 is the difference between the fifth distance $D_5$ and the fourth distance $D_4$ (depth loading=$D_5$−$D_4$). In some embodiments the use of the second etching process 303 allows for control of the depth loading such that the depth loading remains between about −3 nm and about 3 nm. This is much better than the plasma based etches which achieve a depth loading of greater than 5 nm, such as to nm, and allows for improved depth loading control, which can improve wafer acceptance test results and device performance (e.g., benefit the $I_{on}$) for both NMOSFETs and PMOSFETS.

Figure 5:
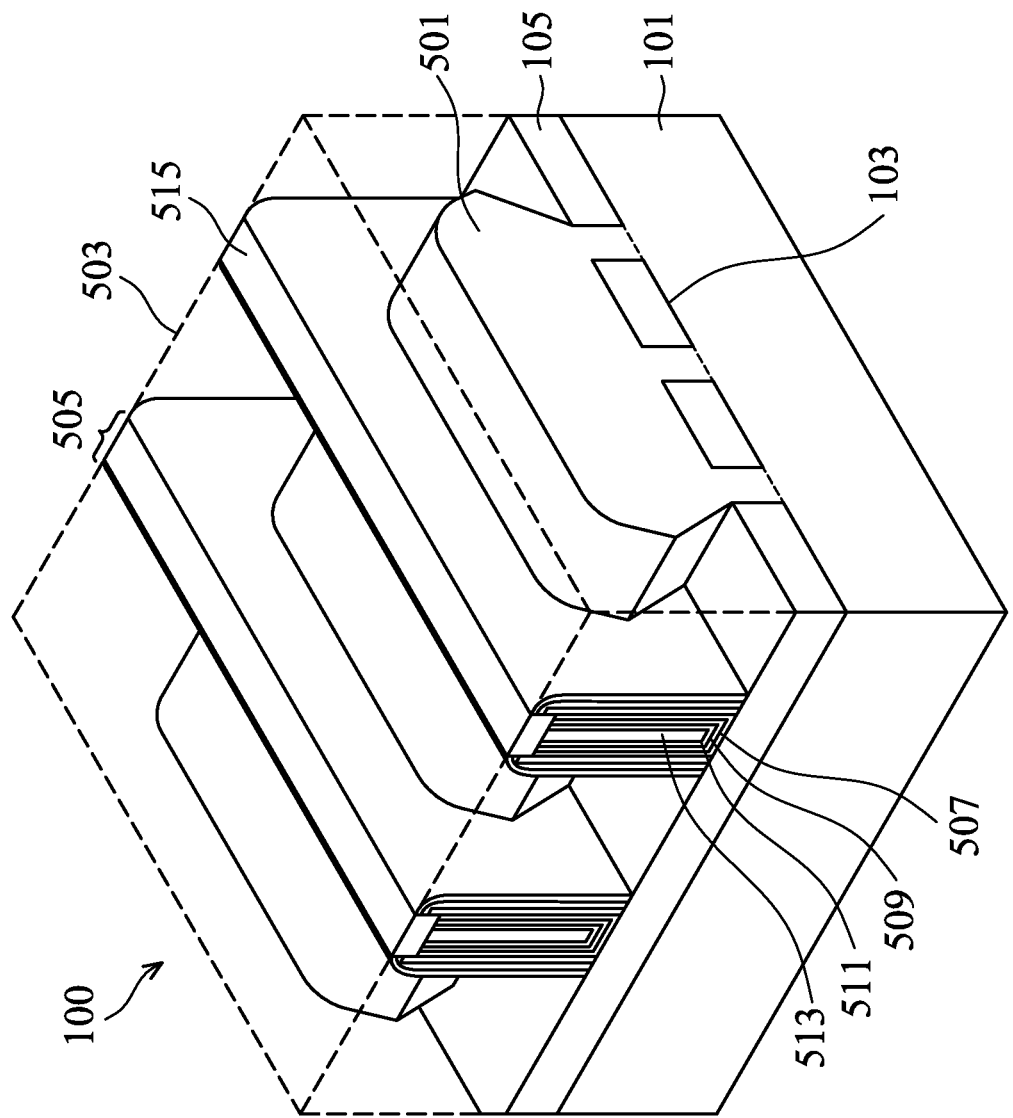
FIG. 5 illustrates a replacement gate process in accordance with some embodiments.

FIG. 5 illustrates that, once the second openings 301 have been formed within the fins 107, source/drain regions 501 may be grown to fill and overfill the second openings 301. In an embodiment to form the source/drain regions 501, a hard mask (not separately illustrated), is placed and patterned to cover the dummy gate electrode 111 to prevent growth and the source/drain regions 501 may be regrown within the second openings 301. In an embodiment the source/drain regions 501 may be regrown and, in some embodiments the source/drain regions 501 may be regrown to form a stressor that will impart a stress to the channel regions of the fins 107 located underneath the gate stacks 115. In an embodiment wherein the fins 107 comprise silicon and the FinFET is a p-type device, the source/drain regions 501 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes. In an embodiment the source/drain regions 501 may be formed to have a height over the first isolation regions 105 of between about 20 nm and about too nm, such as about 50 nm. However, any suitable height may be utilized.

Once the source/drain regions 501 are formed, dopants may be implanted into the source/drain regions 501 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the gate stacks 115 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions 501 is removed. In an embodiment the hard mask may be removed using, e.g., a wet or dry etching process that is selective to the material of the hard mask. However, any suitable removal process may be utilized.

FIG. 5 also illustrates a formation of an inter-layer dielectric (ILD) layer 503 (illustrated in dashed lines in FIG. 5 in order to more clearly illustrate the underlying structures) over the gate stacks 115 and the source/drain regions 501. The ILD layer 503 may comprise a material such as boron phosphorous silicate glass (BPSG), although any suitable dielectrics may be used. The ILD layer 503 may be formed using a process such as PECVD, although other processes, such as LPCVD, may alternatively be used. The ILD layer 503 may be formed to a thickness of between about 100 Å and about 3,000 Å. Once formed, the ILD layer 503 may be planarized using, e.g., a planarization process such as chemical mechanical polishing process, although any suitable process may be utilized.

After the formation of the ILD layer 503, the material of the dummy gate electrode iii and the dummy gate dielectric 109 may be removed and replaced to form a replacement gate stack 505. In an embodiment the dummy gate electrode 111 may be removed using, e.g., a wet or dry etching process that utilizes etchants that are selective to the material of the dummy gate electrode iii. However, any suitable removal process may be utilized.

Once the dummy gate electrode iii has been removed, the openings left behind may be refilled to form the replacement gate stack 505. In a particular embodiment the replacement gate stack 505 comprises a first dielectric material 507, a first metal material 509, a second metal material 511, and a third metal material 513. In an embodiment the first dielectric material 507 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 507 may be deposited to a thickness of between about 5 Å and about 100 Å, although any suitable material and thickness may be utilized.

The first metal material 509 may be formed adjacent to the first dielectric material 507 and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 509 may be deposited using a deposition process such as atomic layer deposition, chemical vapor deposition, sputtering, or the like, to a thickness of between about 5 Å and about 200 Å, although any suitable deposition process or thickness may be used.

The second metal material 511 may be formed adjacent to the first metal material 509 and, in particular embodiments, may be different from or similar to the first metal material 509. For example, the second metal material 511 may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material 511 may be deposited using a deposition process such as atomic layer deposition, chemical vapor deposition, sputtering, or the like, to a thickness of between about 5 Å and about 200 Å, although any suitable deposition process or thickness may be used.

The third metal material 513 fills a remainder of the opening left behind by the removal of the dummy gate electrode 111. In an embodiment the third metal material 513 is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode 111. In a particular embodiment the third metal material 513 may be deposited to a thickness of between about 5 Å and about 500 Å, although any suitable material, deposition process, and thickness may be utilized.

Once the opening left behind by the removal of the dummy gate electrode 111 has been filled, the materials may be planarized in order to remove any material that is outside of the opening left behind by the removal of the dummy gate electrode 111. In a particular embodiment the removal may be performed using a planarization process such as chemical mechanical polishing. However, any suitable planarization and removal process may be utilized.

After the materials of the replacement gate stack 505 have been formed and planarized, the materials of the replacement gate stack 505 may be recessed and capped with a capping layer 515. In an embodiment the materials of the replacement gate stack 505 may be recessed using, e.g., a wet or dry etching process that utilizes etchants selective to the materials of the replacement gate stack 505. However, any suitable process may be utilized.

Once the materials of the replacement gate stack 505 have been recessed, the capping layer 515 may be deposited and planarized. In an embodiment the capping layer 515 is a material such as SiN, SiON, SiCON, SiC, SiOC, combinations of these, or the like, deposited using a deposition process such as atomic layer deposition, chemical vapor deposition, sputtering, or the like. The capping layer 515 may be deposited to a thickness of between about 5 Å and about 200 Å, and then planarized using a planarization process such as chemical mechanical polishing such that the capping layer 515 is planar.

Once the replacement gate stack 505 has been formed, additional processing may be continued. For example, contacts to the source/drain regions 501 may be formed through the ILD layer 503, additional dielectric layers (not separately illustrated) may be formed over the ILD layer 503, contacts to the replacement gate stack 505 may be formed, and metallization layers may be formed in order to interconnect the various devices. Any suitable additional steps may be utilized in order to help manufacture the various embodiments, and all such steps are fully intended to be included within the scope of the embodiments.

In accordance with an embodiment, a method of manufacturing a semiconductor device which comprises forming a gate stack over a semiconductor substrate and forming a first opening in the semiconductor substrate with a first etching process is provided. The first opening is reshaped into a second opening using a second etching process different from the first etching process, wherein the second etching process is a radical etch process.

In accordance with another embodiment, a method of manufacturing a semiconductor device comprising forming a dummy gate stack over a semiconductor fin of a substrate, the dummy gate stack comprising a spacer structure, is provided. A portion of the fin is removed to form a first opening, wherein the first opening is formed with an anisotropic etching process. The first opening is modified into a second opening, wherein the modifying comprises forming a plasma from a precursor and directing radicals from the plasma to the semiconductor fin while filtering charged particles from the plasma from reaching the semiconductor fin.

In accordance with yet another embodiment, a semiconductor device comprising a first semiconductor fin over a substrate and a gate stack overlying the first semiconductor fin is provided. A first spacer is on a sidewall of the gate stack and a first opening within the first semiconductor fin and undercutting the first spacer, the first opening having a surface proximity measurement to tip proximity measurement difference of less than 3 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor fin over a substrate;
a gate stack overlying a channel region within the semiconductor fin, the channel region having a width no larger than about 40 nm; and
a plurality of openings extending into the semiconductor fin on opposite sides of the gate stack, each of the plurality of openings extending into the semiconductor fin a first distance of between about 300 Å and about 450 Å, wherein a difference between two of the plurality of openings is between −3 nm and 3 nm.

2. The semiconductor device of claim 1, wherein the gate stack has an overhanging eave which extends a second distance over one of the plurality of openings of less than about 4 nm.

3. The semiconductor device of claim 2, wherein the second distance is greater than about 1 nm.

4. The semiconductor device of claim 1, wherein the semiconductor fin has a surface proximity measurement of between about 20 Å and about 50 Å.

5. The semiconductor device of claim 1, wherein the semiconductor fin has a surface proximity measurement of between about 50 Å and about 200 Å.

6. The semiconductor device of claim 1, wherein the semiconductor fin has a tip proximity measurement of less than about 4 nm.

7. The semiconductor device of claim 1, wherein the semiconductor fin has a tip proximity measurement of greater than about 1 nm.

8. A semiconductor device comprising:
a first set of source/drain regions on opposite sides of a first gate stack, the first set of source/drain regions extending into a semiconductor fin a first distance; and
a second set of source/drain regions on opposite sides of a second gate stack, the second set of source/drain regions extending into the semiconductor fin a second distance different from the first distance, wherein the second distance is between about 300 Å and about 450 Å and wherein a difference between the first distance and the second distance is between about −3 nm and about 3 nm.

9. The semiconductor device of claim 8, wherein the first gate stack is separated from a third gate stack by a third distance of less than about 100 nm.

10. The semiconductor device of claim 9, wherein the third distance is between about 20 nm and about 50 nm.

11. The semiconductor device of claim 10, wherein the second gate stack is separated from a fourth gate stack by a fourth distance greater than the third distance.

12. The semiconductor device of claim 11, wherein the fourth distance is between about 100 nm and about 400 nm.

13. The semiconductor device of claim 8, wherein the first distance is between about 30 nm and about 70 nm.

14. The semiconductor device of claim 8, wherein the first distance is between about 30 nm and about 55 nm.

15. A semiconductor device comprising:
a first opening extending into a semiconductor fin, wherein a first portion of the semiconductor fin adjacent to the first opening has a first surface proximity measurement to first tip proximity measurement difference of less than 3 nm;
a second opening extending into the semiconductor fin on an opposite side of a channel region from the first opening, wherein a second portion of the semiconductor fin adjacent to the second opening has a second surface proximity to second tip proximity measurement difference of less than 3 nm;
a third opening extending into the semiconductor fin, wherein the third opening extends into the semiconductor fin further than the second opening; and
a fourth opening extending into the semiconductor fin on an opposite side of a second channel region from the third opening, wherein the fourth opening extends into the semiconductor fin a same distance as the third opening.

16. The semiconductor device of claim 15, wherein the first opening and the second opening extend into the semiconductor fin a first distance of between about 30 nm and about 70 nm.

17. The semiconductor device of claim 16, wherein the first distance is between about 30 nm and about 55 nm.

18. The semiconductor device of claim 17, wherein the third opening and the fourth opening extend into the semiconductor fin a second distance of between about 30 nm and about 70 nm.

19. The semiconductor device of claim 18, wherein the second distance is between about 30 nm and about 50 nm.

20. The semiconductor device of claim 15, wherein the channel region has a channel length measured at half of a height of the semiconductor fin of between 20 nm and about 40 nm.

* * * * *